(12) United States Patent
Gautama

(10) Patent No.: US 8,319,507 B2
(45) Date of Patent: Nov. 27, 2012

(54) SYSTEM AND METHOD FOR SENSING AN AMPLIFIER LOAD CURRENT

(75) Inventor: Temujin Gautama, Leuven (BE)

(73) Assignee: NXP B.V., Eindhoven (NL)

( * ) Notice: Subject to any disclaimer, the term of this patent is extended or adjusted under 35 U.S.C. 154(b) by 467 days.

(21) Appl. No.: 12/702,204

(22) Filed: Feb. 8, 2010

(65) Prior Publication Data

US 2011/0193578 A1  Aug. 11, 2011

(51) Int. Cl.
*G01R 27/08* (2006.01)
*G01R 19/00* (2006.01)
*G01R 35/04* (2006.01)

(52) U.S. Cl. .......................... 324/713; 702/64; 702/107

(58) Field of Classification Search ............... 324/713, 324/691, 649, 600; 330/2; 702/107, 1, 57, 702/64
See application file for complete search history.

(56) References Cited

U.S. PATENT DOCUMENTS

| | | | |
|---|---|---|---|
| 4,216,517 A | | 8/1980 | Takahashi |
| 4,320,306 A | * | 3/1982 | Kohga et al. .................... 307/51 |
| 5,068,903 A | | 11/1991 | Walker |
| 5,577,126 A | | 11/1996 | Klippel |
| 5,652,542 A | | 7/1997 | Fink |
| 5,719,526 A | * | 2/1998 | Fink ................................. 330/2 |
| 5,862,515 A | * | 1/1999 | Kobayashi et al. ............. 702/63 |
| 6,429,641 B1 | * | 8/2002 | Montrose .................. 324/123 C |
| 6,940,981 B2 | | 9/2005 | Neunaber |
| 7,372,966 B2 | | 5/2008 | Bright |
| 2003/0142832 A1 | | 7/2003 | Meerkoetter et al. |
| 2008/0284444 A1 | * | 11/2008 | Li et al. ......................... 324/430 |

* cited by examiner

Primary Examiner — Hoai-An D Nguyen

(57) ABSTRACT

A system and method for sensing a load current that flows from an amplifier into a load of the amplifier involves obtaining a voltage drop across internal impedance of the amplifier and computing the load current using the internal impedance and the voltage drop across the internal impedance.

16 Claims, 4 Drawing Sheets

US 8,319,507 B2

SYSTEM AND METHOD FOR SENSING AN AMPLIFIER LOAD CURRENT

Embodiments of the invention relate generally to electronic systems and, more particularly, to a system and method for sensing an amplifier load current.

A load current that flows from an amplifier into a load of the amplifier delivers power to the load. Sensing the load current is often required for protecting the amplifier and the load. Additionally, sensed values of the load current can be used to characterize, to predict, and to control the behavior of the load.

Traditional load current sensing techniques involve placing an additional shunt resistor in series with the load and measuring a voltage drop across the shunt resistor. The voltage drop across the shunt resistor is proportional to the load current and inversely proportional to the resistance value of the shunt resistor. However, adding the additional shunt resistor increases component cost for sensing the load current. In addition to the component cost increase, the shunt resistor typically has a low resistance in order to be non-intrusive to the amplifier and to the load so that a signal being sent through the amplifier and the load is not affected by the shunt resistor. Furthermore, to calculate the load current using the resistance value of the shunt resistor, the shunt resistor usually has to maintain a constant resistance value even though the environmental temperature may change. Handling such a temperature insensitive shunt resistor with a low resistance value demands extra attention and effort, which makes it more difficult to sense the load current. Thus, there is a need for a system and method for sensing an amplifier load current without using a shunt resistor.

A system and method for sensing a load current that flows from an amplifier into a load of the amplifier involves obtaining a voltage drop across internal impedance of the amplifier and computing the load current using the internal impedance and the voltage drop across the internal impedance. Compared to a traditional load current sensing technique that involves placing an additional shunt resistor in series with the load and measuring a voltage drop across the shunt resistor, computing the load current using the internal impedance of the amplifier and the voltage drop across the internal impedance eliminates the requirement for an additional shunt resistor. Eliminating the additional shunt resistor enables simple and economical sensing of a load current that flows from an amplifier into a load of the amplifier.

In an embodiment, a method for sensing a load current that flows from an amplifier into a load of the amplifier includes obtaining a voltage drop across internal impedance of the amplifier and computing the load current using the internal impedance and the voltage drop across the internal impedance.

In an embodiment, a system for sensing a load current that flows from an amplifier into a load of the amplifier includes a voltage obtaining unit and a computing unit. The voltage obtaining unit is configured to obtain a voltage drop across internal impedance of the amplifier. The computing unit is configured to compute the load current using the internal impedance and the voltage drop across the internal impedance.

In an embodiment, the system for sensing a load current that flows from an amplifier into a load of the amplifier includes a digital signal source, a digital-to-analog converter, an analog-to-digital converter, and a digital signal processing module. The digital signal source is configured to generate a digital input voltage. The digital-to-analog converter is configured to convert the digital input voltage into an analog input voltage, where the analog input voltage is applied to the amplifier to generate an analog output voltage. The analog-to-digital converter is configured to convert the analog output voltage into a digital output voltage. The digital signal processing module is configured to multiply the digital input voltage by a gain factor of the amplifier to produce a voltage product, to calculate a voltage drop across internal impedance of the amplifier as a voltage difference between the digital output voltage and the voltage product, and to compute the load current using the voltage drop across the internal impedance and the internal impedance.

Other aspects and advantages of embodiments of the present invention will become apparent from the following detailed description, taken in conjunction with the accompanying drawings, depicted by way of example of the principles of the invention.

Throughout the description, similar reference numbers may be used to identify similar elements.

Figure 1:
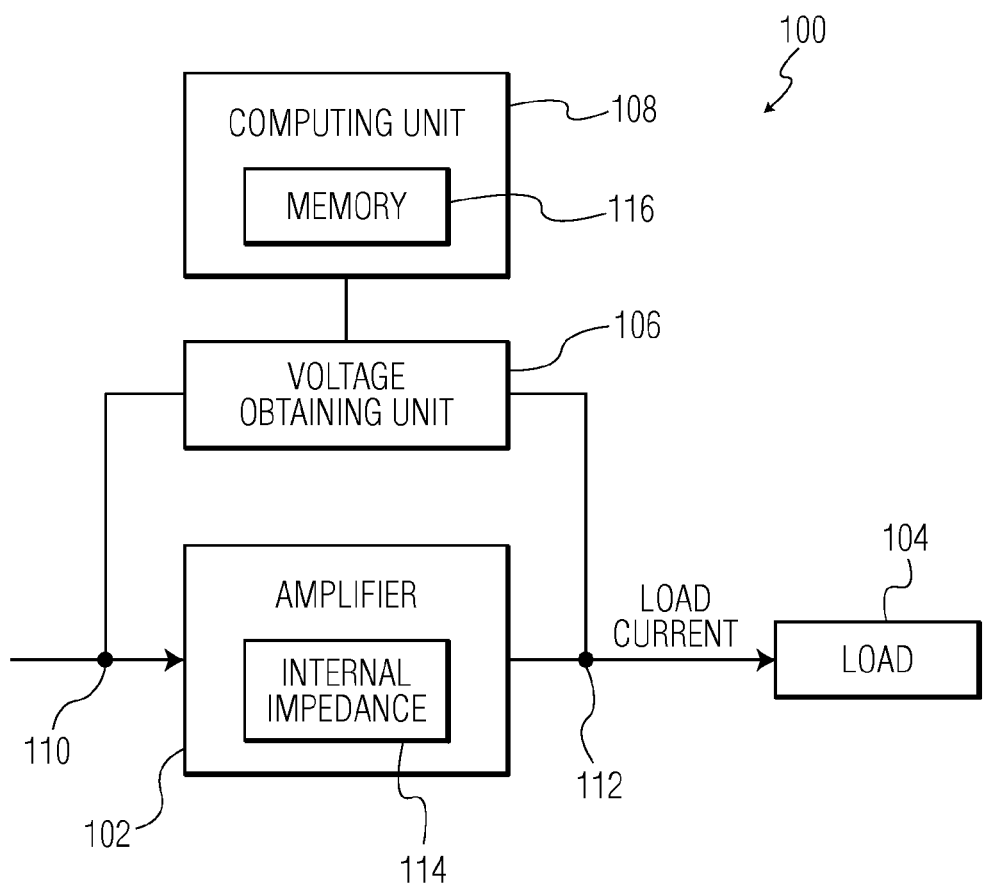
FIG. 1 is a schematic block diagram of a system for sensing a load current that flows from an amplifier into a load of the amplifier in accordance with an embodiment of the invention.

FIG. 1 is a schematic block diagram of a system 100 for sensing a load current that flows from an amplifier 102 into a load 104 of the amplifier in accordance with an embodiment of the invention. The amplifier may be electrically coupled to the load of the amplifier directly. The load of the amplifier is an electrical device that is powered by the load current. For example, the load of the amplifier is a loudspeaker. As shown in FIG. 1, the system includes a voltage obtaining unit 106 and a computing unit 108. Although the voltage obtaining unit is separate from the computing unit in the embodiment of FIG. 1, the voltage obtaining unit may be integrated with the computing unit in other embodiments.

In the embodiment of FIG. 1, the voltage obtaining unit 106 is coupled to an input terminal 110 and to an output terminal 112 of the amplifier 102. The amplifier has internal impedance 114, which is also referred to as output impedance of the amplifier. In the embodiment of FIG. 1, the internal impedance is the internal electrical impedance of the amplifier. The internal impedance of the amplifier may be frequency dependent. In other words, the internal impedance of the amplifier may be dependent on the operating frequency of the internal impedance. Alternatively, the internal impedance of the amplifier may be independent from the operating frequency of the internal impedance. For example, the internal impedance may be a resistance. In this case, the internal impedance of the amplifier is represented by a frequency independent resistance. The voltage obtaining unit is configured to obtain a voltage drop across the internal impedance of the amplifier.

The computing unit 108 is coupled to the voltage obtaining unit 106. The computing unit is configured to compute the load current using the internal impedance 114 and the voltage drop across the internal impedance of the amplifier. For example, the computing unit computes the load current using a model of the internal impedance with respect to the operating frequency of the amplifier 102 and the voltage drop across the internal impedance of the amplifier. The voltage drop across the internal impedance is caused by the load current. The voltage drop across the internal impedance, the load current, and the internal impedance of the amplifier can be expressed in the time domain as:

$$V = I * Z \quad (1)$$

where V represents the voltage drop across the internal impedance of the amplifier, I represents the load current, * represents the convolution operator, and Z represents the internal impedance of the amplifier. V, I, and Z may be continuous time representations or discrete time representations. For example, the internal impedance Z can be characterized by a frequency domain transfer function, $Z(\omega)$, or by a time-domain impulse response, $Z(t)$, or by a discrete-time equivalent $Z[k]$.

The voltage obtaining unit 106 may be further configured to measure an input voltage of the amplifier 102 at the input terminal 110 of the amplifier, to measure an output voltage of the amplifier at the output terminal 112 of the amplifier, to multiply the input voltage by a gain factor of the amplifier to produce a voltage product, and to calculate the voltage drop across the internal impedance 114 as a voltage difference between the output voltage and the voltage product. The load current, the internal impedance, the voltage drop across the internal impedance, the input voltage, the output voltage, and the gain factor can be expressed in the time domain as:

$$V = V_{in} \times G - V_{out} = I * Z \quad (2)$$

where V represents the voltage drop across the internal impedance, $V_{in}$ represents the input voltage, x represents the multiplication operator, G represents the gain factor, □ represents the subtraction operator, $V_{out}$ represents the output voltage, I represents the load current, * represents the convolution operator, and Z represents the internal impedance. V, $V_{in}$, $V_{out}$, Z, and I may be continuous time representations or discrete time representations.

In an embodiment, the computing unit 108 is further configured to obtain the value of the internal impedance 114 of the amplifier 102 in a calibration stage or to obtain a model of the internal impedance with respect to the operating frequency of the amplifier 102 from the manufacturer of the amplifier. In the embodiment of FIG. 1, the computing unit includes optional memory 116 configured to store the value of the internal impedance of the amplifier and the value of the load current. The stored value of the load current can be used to characterize, to predict, and to control the behavior of the load 104.

The load current may be sensed without placing a shunt resistor in series with the load 104 and measuring a voltage drop across the shunt resistor. For example, the system 100 in the embodiment of FIG. 1 does not include a shunt resistor in series with the load. In the embodiment of FIG. 1, the load current is sensed by obtaining a voltage drop across the internal impedance 114 of the amplifier 102 and computing the load current using the internal impedance and the voltage drop across the internal impedance. Compared to a traditional load current sensing technique that involves placing an additional shunt resistor in series with the load and measuring a voltage drop across the shunt resistor, obtaining a voltage drop across internal impedance of the amplifier and computing the load current using the internal impedance and the voltage drop across the internal impedance eliminates the requirement for the additional shunt resistor. Adding the additional shunt resistor in series with the load increases component cost for sensing the load current. By eliminating the additional shunt resistor, component cost for sensing the load current is lowered. Additionally, the additional shunt resistor is typically temperature insensitive and usually has a low resistance value. Handling the temperature insensitive shunt resistor with the low resistance value demands extra attention and effort, which will increase the difficulty of sensing the load current. By eliminating the additional shunt resistor, the extra attention and effort for handling the temperature insensitive shunt resistor with the low resistance value is eliminated and the difficulty of sensing the load current is reduced.

In some embodiments, the internal impedance 114 of the amplifier 102 is a frequency independent resistance. The resistance of the amplifier may not be known to the computing unit 108 or not known with sufficient accuracy to the computing unit. In this case, only a signal that is proportional to the load current can be computed by the system 100 of FIG. 1. Although the load current cannot be computed, a signal that is proportional to the load current may be sufficient to some applications. For example, in a loudspeaker linearization application, knowing a signal that is proportional to the load current is sufficient to estimate the location and the width of the resonance peak in the loudspeaker impedance curve. The location and width of the resonance peak can yield sufficient information to perform the linearization operation.

Figure 2:
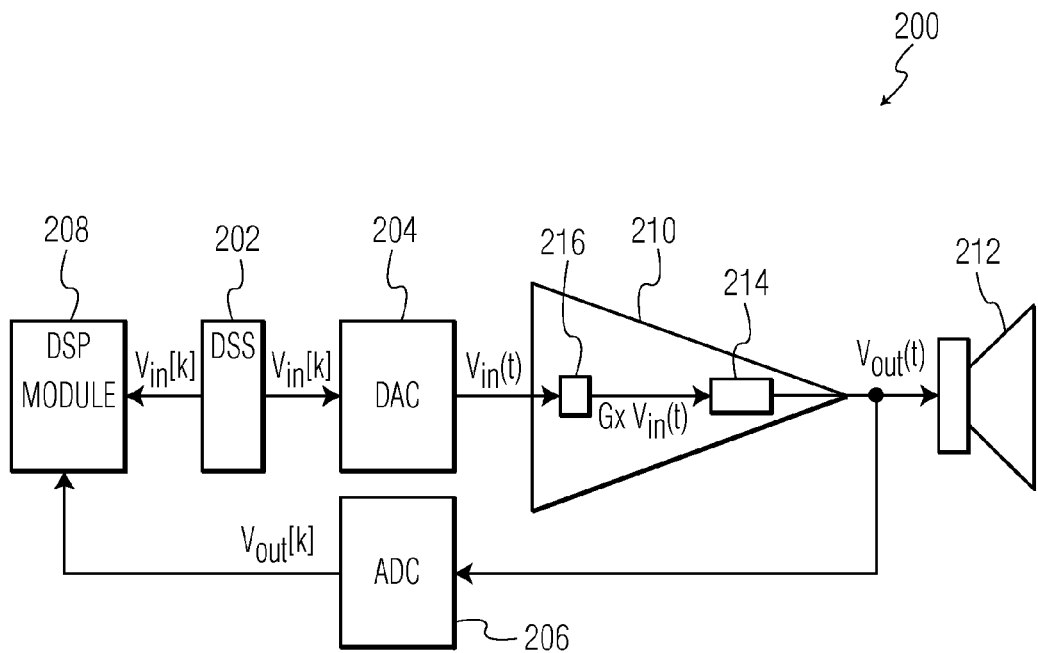
FIG. 2 depicts an embodiment of the system of FIG. 1 with digital signal processing (DSP) components.

The system 100 of FIG. 1 can be conveniently implemented with DSP components. An embodiment of the system of FIG. 1 with DSP components is depicted in FIG. 2. As shown in FIG. 2, the system 200 includes a digital signal source (DSS) 202, a digital-to-analog converter (DAC) 204, an analog-to-digital converter (ADC) 206, and a DSP module 208. The system is configured to sense a load current that flows from an amplifier 210 into a load 212, which in this case is a loudspeaker. The DSS, the DAC, the ADC, and the DSP module perform a function that is similar to the function of the voltage obtaining unit 106 of the embodiment of FIG. 1 and the DSP module performs a function that is similar to the function of the computing unit 108 of the embodiment of FIG. 1.

In the embodiment of FIG. 2, the DSS 202 is configured to generate a digital input voltage "$V_{in}[k]$," where k represents an index of discrete time. The digital input voltage $V_{in}[k]$ is provided to the DSP module 208 and is applied to the DAC 204. Although the DSS is separate from the DSP module in the embodiment of FIG. 2, the DSS may be integrated with the DSP module in other embodiments.

The DAC 204 is coupled to the DSS 202 and to the amplifier 210. The DAC is configured to convert the digital input voltage $V_{in}[k]$ into an analog input voltage "$V_{in}(t)$," where t represents time. The analog input voltage $V_{in}(t)$ is applied to the amplifier to generate an analog output voltage "$V_{out}(t)$."

The amplifier 210 has internal impedance 214 and a voltage gain factor. In the embodiment of FIG. 2, the internal impedance of the amplifier is internal electrical impedance. The amplifier is coupled to the loudspeaker 212. As shown in FIG. 2, the amplifier scales the input voltage $V_{in}(t)$ by a voltage gain factor "G" using an "ideal" amplifier 216, i.e., an amplifier with zero internal impedance. The ideal amplifier applies a voltage to the internal impedance. The applied voltage has a value that is equal to the product of the analog input voltage $V_{in}(t)$ and the voltage gain factor G. The amplifier may be integrated into the DAC 204 when the amplifier is used for a headphone or a speakerphone. In some embodiments, the amplifier and the system 200 can be integrated into a single integrated circuit (IC) to reduce the manufacturing cost and the dimensions of the amplifier and the system.

The ADC 206 is coupled between the amplifier 210 and the loudspeaker 212 and is configured to convert the analog output voltage $V_{out}(t)$ into a digital output voltage "$V_{out}[k]$." The digital output voltage $V_{out}[k]$ is provided to the DSP module 208 for computing the load current.

The DSP module 208 is configured to multiply the digital input voltage $V_{in}[k]$ by a gain factor of the amplifier 210 to produce a voltage product, to calculate a voltage drop across internal impedance 214 of the amplifier as a voltage difference between the digital output voltage $V_{out}[k]$ and the voltage product, and to compute the load current using the voltage drop across the internal impedance and the internal impedance. The load current, the internal impedance, the voltage drop across the internal impedance, the digital input voltage, the digital output voltage, and the gain factor can be expressed in the time domain as:

$$V[k]=V_{in}[k]\times G-V_{out}[k]=I[k]*Z[k] \qquad (3)$$

where V[k] represents the voltage drop across the internal impedance in discrete time, x represents the multiplication operator, G represents the voltage gain factor of the amplifier, $V_{in}[k]\times G$ represents the voltage product, □ represents the subtraction operator, I[k] represents the load current in discrete time, * represents the convolution operator, and Z[k] represents the internal impedance in discrete time.

The systems 100, 200 in the embodiments of FIGS. 1 and 2 can be used, for example, for amplifier protection, loudspeaker protection, loudspeaker output maximization, loudspeaker response linearization, and loudspeaker voice coil temperature detection. The systems in the embodiments of FIGS. 1 and 2 can be used to generate an impedance curve that represents a function between electrical impedance of the load 104, 212 of the amplifier 102, 210 and an operating frequency of the load. For example, the DSS 202 provides a test signal, e.g., a white noise segment, to the DSP module 208 and the DAC 204. The output from the DAC is applied to the amplifier 210. The output voltage of the amplifier is provided to the ADC 206 and is applied to the load 212. The output $V_{out}[k]$ from the ADC and the test signal from the DSS are used by the DSP module to calculate a load current I[k]. The output voltage $V_{out}[k]$ and the load current I[k] can be transformed to frequency domain equivalents $V_{out}(\omega)$ and $I(\omega)$, where $\omega$ represents the operating frequency of the amplifier and the load. When the load is terminated to the ground, the impedance of the load, the output voltage $V_{out}(\omega)$, and the load current $I(\omega)$ can be expressed in the frequency domain as:

$$V_{out}(\omega)=Z_{load}(\omega)\times I(\omega) \qquad (4)$$

where $Z_{load}(\omega)$ represents the impedance of the load and x represents the multiplication operator because a multiplication operation in the frequency domain corresponds to a convolution operation in the time domain. When the load is a loudspeaker, the impedance curve yields information regarding the electro-acoustical properties of the loudspeaker that can be used for predicting and controlling the behavior of the loudspeaker.

Figure 3A:
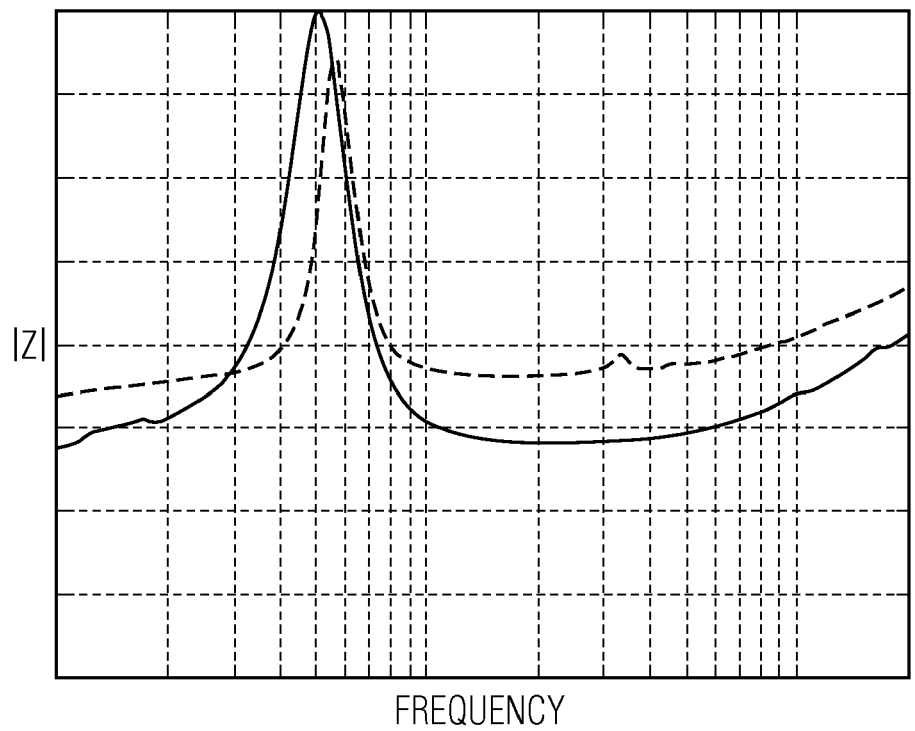
FIG. 3A and FIG. 3B show impedance curves for two different exemplary loudspeakers.
Figure 3B:
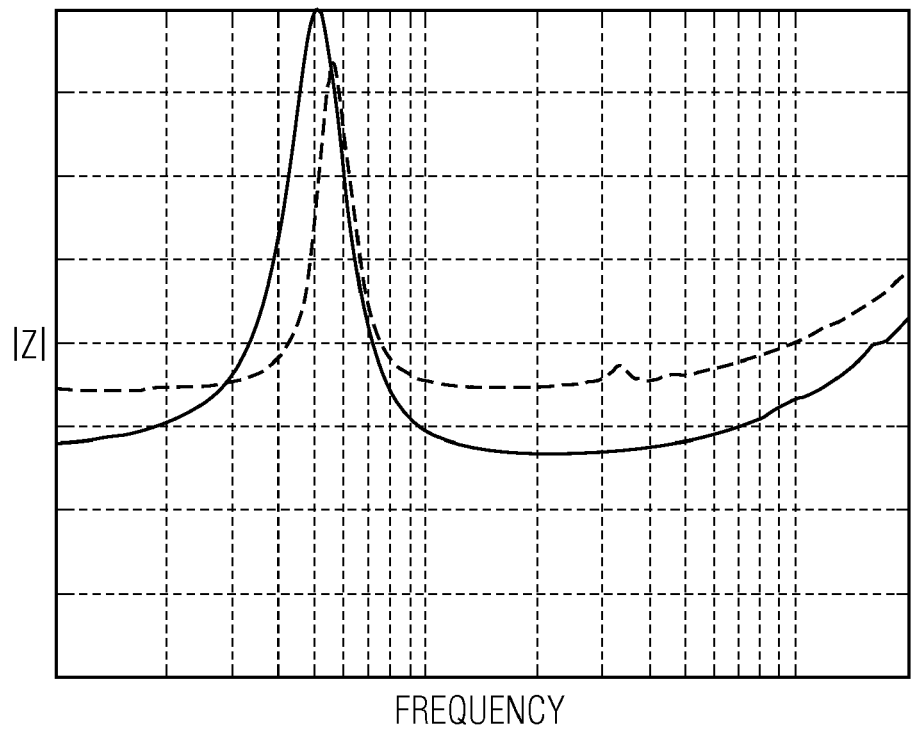

FIG. 3A and FIG. 3B show impedance curves for two different exemplary loudspeakers that use the systems 100, 200 in the embodiments of FIGS. 1 and 2 versus a traditional shunt resistance. For all of the impedance curves, the X axis represents the operating frequency of the load and the Y axis represents the magnitude "|z|" of the electrical impedance of the loudspeaker. Impedance curves for two different exemplary loudspeakers are represented by solid and dashed lines, respectively. The two impedance curves that are generated using the systems in the embodiments of FIGS. 1 and 2 are shown in FIG. 3A. The other two impedance curves that are generated using the traditional shunt resistance are shown in FIG. 3B. As shown in FIG. 3A and FIG. 3B, the two impedance curves that are generated using the systems in the embodiments of FIGS. 1 and 2 are nearly identical to the other two impedance curves that are generated using the traditional shunt resistance. Compared to generating impedance curves using the traditional shunt resistance, generating impedance curves using the systems in the embodiments of FIGS. 1 and 2 achieves the same result with fewer components.

Figure 4:
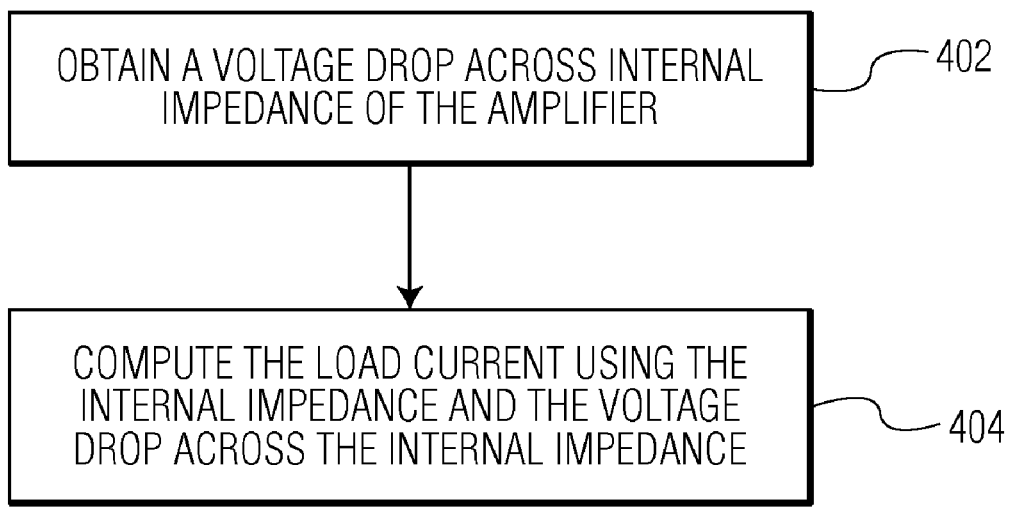
FIG. 4 is a process flow diagram of a method for sensing a load current that flows from an amplifier into a load of the amplifier.

FIG. 4 is a process flow diagram of a method for sensing a load current that flows from an amplifier into a load of the amplifier. At block 402, a voltage drop across internal impedance of the amplifier is obtained. At block 404, the load current is computed using the internal impedance and the voltage drop across the internal impedance.

The various components or units of the embodiments that have been described or depicted may be implemented by software that is stored in a computer readable medium, hardware, or a combination of software that is stored in a computer readable medium and hardware. For example, the computing unit in the embodiment of FIG. 1 and the DSP module in the embodiment of FIG. 2 are implemented by a processor.

Although the operations of the method herein are shown and described in a particular order, the order of the operations of the method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

Additionally, although specific embodiments of the invention that have been described or depicted include several components described or depicted herein, other embodiments of the invention may include fewer or more components to implement less or more functionality.

Furthermore, although specific embodiments of the invention have been described and depicted, the invention is not to be limited to the specific forms or arrangements of parts so described and depicted. The scope of the invention is to be defined by the claims appended hereto and their equivalents.

What is claimed is:

1. A method for sensing a load current that flows from an amplifier into a load of the amplifier, the method comprising:
obtaining a voltage drop across internal impedance of the amplifier; and
computing the load current using the internal impedance and the voltage drop across the internal impedance,
wherein obtaining the voltage drop across the internal impedance comprises:
generating a digital input voltage using a digital signal source;
converting the digital input voltage into an analog input voltage using a digital-to-analog converter;
applying the analog input voltage to the amplifier and generating an analog output voltage;
converting the analog output voltage into a digital output voltage using an analog-to-digital converter;
multiplying the digital input voltage by a gain factor of the amplifier to produce a voltage product using a digital signal processing module; and
calculating the voltage drop across the internal impedance as a voltage difference between the digital output voltage and the voltage product using the digital signal processing module.

2. The method of claim 1, wherein the voltage drop across the internal impedance, the load current, and the internal impedance are expressed as:

$$V=I*Z,$$

where V represents the voltage drop across the internal impedance, I represents the load current, * represents the convolution operator, and Z represents the internal impedance.

3. The method of claim 1, wherein the load current is sensed without measuring a voltage drop across a shunt resistor.

4. The method of claim 1, wherein the load of the amplifier comprises a loudspeaker.

5. The method of claim 2, wherein the internal impedance of the amplifier is frequency dependent.

6. The method of claim 2, wherein the internal impedance of the amplifier is a frequency independent resistance.

7. The method of claim 1, wherein the load current, the internal impedance, the voltage drop across the internal impedance, the digital input voltage, the digital output voltage, and the gain factor are expressed as:

$$V[k]=V_{in}[k]\times G-V_{out}[k]=I[k]*Z[k],$$

where V[k] represents the voltage drop across the internal impedance in discrete time, k represents an index of discrete time, $V_{in}[k]$ represents the digital input voltage, G represents the gain factor, $V_{out}[k]$ represents the digital output voltage, I[k] represents the load current in discrete time, * represents the convolution operator, and Z[k] represents the internal impedance in discrete time.

8. A system for sensing a load current that flows from an amplifier into a load of the amplifier, the system comprising:
a voltage obtaining unit configured to obtain a voltage drop across internal impedance of the amplifier; and
a computing unit configured to compute the load current using the internal impedance and the voltage drop across the internal impedance,
wherein the voltage obtaining unit is further configured to:
generate a digital input voltage using a digital signal source;
convert the digital input voltage into an analog input voltage using a digital-to-analog converter;
apply the analog input voltage to the amplifier and generate an analog output voltage;
convert the analog output voltage into a digital output voltage using an analog-to-digital converter;
multiply the digital input voltage by a gain factor of the amplifier to produce a voltage product using a digital signal processing module; and
calculate the voltage drop across the internal impedance as a voltage difference between the digital output voltage and the voltage product using the digital signal processing module.

9. The system of claim 8, wherein the system does not include a shunt resistor in series with the load.

10. The system of claim 8, wherein the internal impedance of the amplifier is represented by a frequency independent resistance.

11. The system of claim 8, wherein the load of the amplifier comprises a loudspeaker.

12. The system of claim 8, wherein the voltage drop across the internal impedance, the load current, and the internal impedance are expressed as:

$$V=I*Z,$$

where V represents the voltage drop across the internal impedance, I represents the load current, * represents the convolution operator, and Z represents the internal impedance.

13. A system for sensing a load current that flows from an amplifier into a load of the amplifier, the system comprising:
a digital signal source configured to generate a digital input voltage;
a digital-to-analog converter configured to convert the digital input voltage into an analog input voltage, wherein the analog input voltage is applied to the amplifier to generate an analog output voltage;
an analog-to-digital converter configured to convert the analog output voltage into a digital output voltage; and
a digital signal processing module configured to multiply the digital input voltage by a gain factor of the amplifier to produce a voltage product, to calculate a voltage drop across internal impedance of the amplifier as a voltage difference between the digital output voltage and the voltage product, and to compute the load current using the voltage drop across the internal impedance.

14. The system of claim 13, wherein the load current, the internal impedance, the voltage drop across the internal impedance, the digital input voltage, the digital output voltage, and the gain factor are expressed as:

$$V[k]=V_{in}[k]\times G-V_{out}[k]=I[k]*Z[k],$$

where V[k] represents the voltage drop across the internal impedance in discrete time, k represents an index of discrete time, $V_{in}[k]$ represents the digital input voltage, G represents the gain factor, $V_{out}[k]$ represents the digital output voltage, I[k] represents the load current in discrete time, * represents the convolution operator, and Z[k] represents the internal impedance in discrete time.

15. The system of claim 13, wherein the system does not include a shunt resistor in series with the load.

16. The system of claim 13, wherein the load of the amplifier comprises a loudspeaker.

* * * * *